(12) United States Patent
Takeuchi

(10) Patent No.: US 6,812,133 B2
(45) Date of Patent: Nov. 2, 2004

(54) FABRICATION METHOD OF SEMICONDUCTOR DEVICE

(75) Inventor: Koichi Takeuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/653,986

(22) Filed: Sep. 4, 2003

(65) Prior Publication Data

US 2004/0063306 A1 Apr. 1, 2004

(30) Foreign Application Priority Data

Sep. 30, 2002 (JP) ..................................... P2002-285321

(51) Int. Cl.[7] ...................... H01L 21/4763; H01L 21/44
(52) U.S. Cl. ...................... 438/623; 438/618; 438/622; 438/637; 438/639; 438/644; 438/675
(58) Field of Search ................................. 438/618, 637, 438/644, 672, 675

(56) References Cited

U.S. PATENT DOCUMENTS 6,211,061 B1 * 4/2001 Chen et al. ................. 438/622
6,426,298 B1 * 7/2002 Chen et al. ................. 438/699
6,448,176 B1 * 9/2002 Grill et al. ................... 438/637
6,514,860 B1 * 2/2003 Okada et al. ................ 438/687
2003/0139034 A1 * 7/2003 Yuang ......................... 438/634

* cited by examiner

*Primary Examiner*—Carl Whitehead, Jr.
*Assistant Examiner*—David L. Hogans
(74) *Attorney, Agent, or Firm*—Rader, Fishman & Grauer PLLC; Ronald P. Kananen

(57) ABSTRACT

The present invention comprises the steps of forming a connection hole in an interlayer insulating film including an organic insulating film; forming an inorganic film covering on an upper surface of the interlayer insulating film and an inner surface of the connection hole; forming an organic film for filling inside the connection hole on an inorganic film; removing the organic film inside the connection hole so as to leave a part of the organic film at a bottom of the connection hole; forming a wiring trench connecting to the connection hole in the interlayer insulating film; removing the organic film inside the connection hole; removing the inorganic film; and forming a trench wiring by filling a conductive material in the wiring trench and inside the connection hole and forming a plug continuing from the trench wiring.

10 Claims, 7 Drawing Sheets

FIG. 8
RELATED ART
FIG. 8A
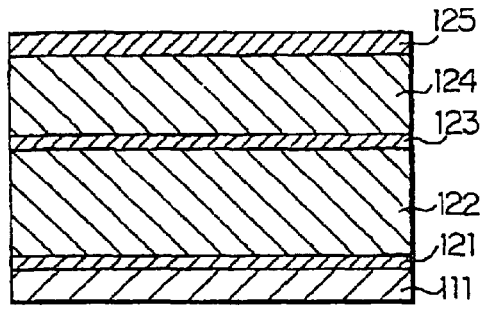
FIG. 8B
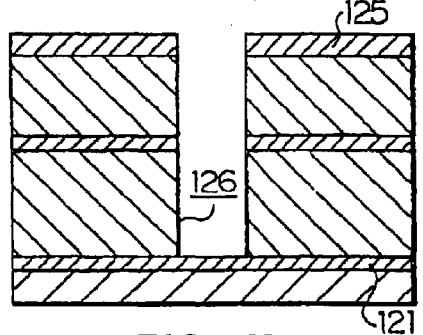
FIG. 8C
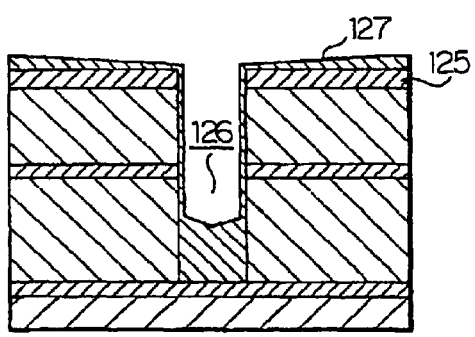
FIG. 8D
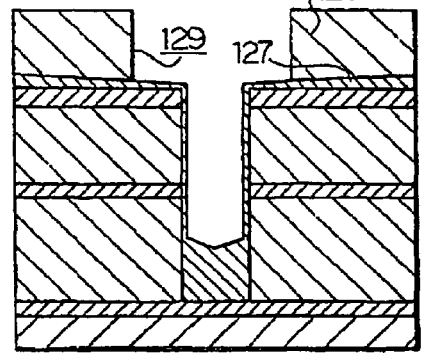
FIG. 8E
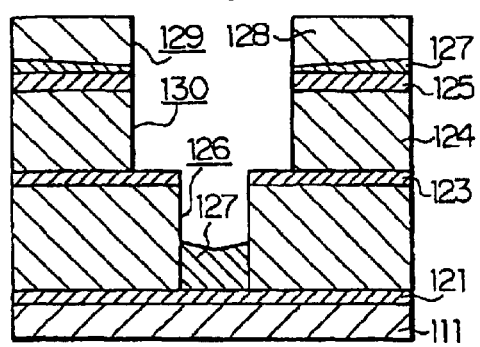
FIG. 8F
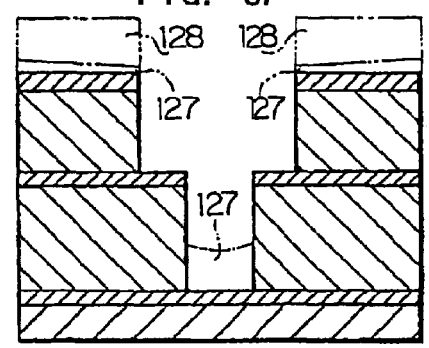
FIG. 8G
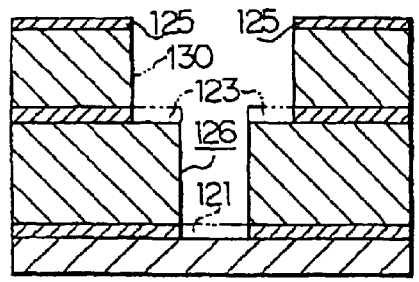
FIG. 8H
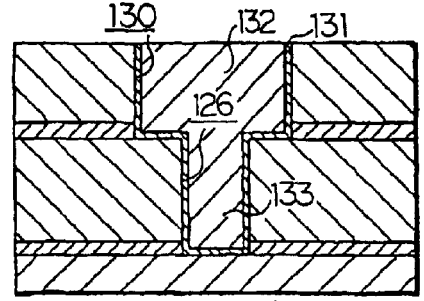

FIG. 9
RELATED ART
FIG. 9A
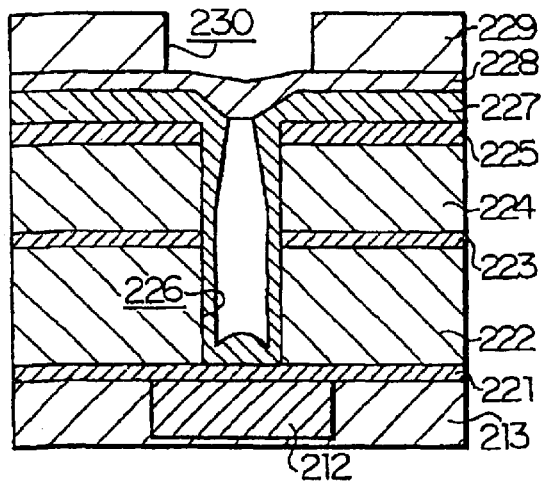
FIG. 9B
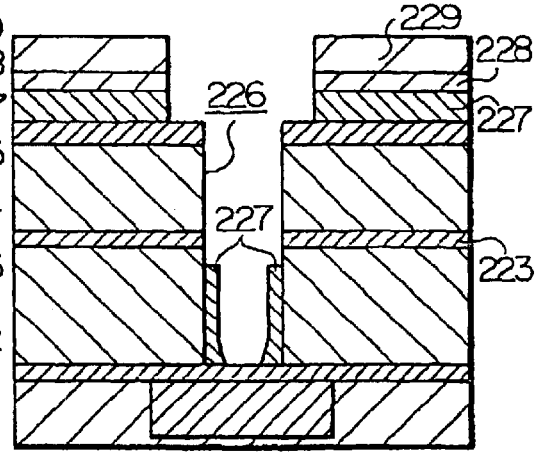
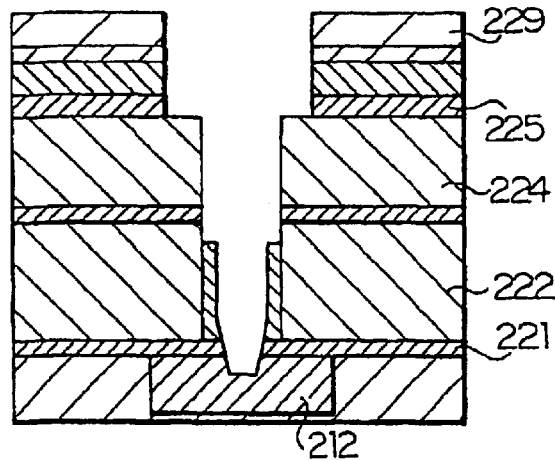
FIG. 9C

FABRICATION METHOD OF SEMICONDUCTOR DEVICE

CROSS REFERENCES TO RELATED APPLICATIONS

The present document is based on Japanese Priority Document JP 2002-285321, filed in the Japanese Patent Office on Sep. 30, 2002, the entire contents of which being incorporated herein by reference.

BACKGROUND OF THE INVENTION

1. Field of the Invention

The present invention relates to a fabrication method of a semiconductor device, and, in particular, relates to a fabrication method of a semiconductor device, in which trench wirings and connection holes are formed by a fine pattern processing.

2. Description of Related Art

Copper has been used as a wiring material in order to meet demands for a semiconductor circuit operating at a higher speed and at a lower power consumption. Due to difficulty in etching copper, a dual damascene process in which holes and trenches for forming wirings and via-plugs are formed in an interlayer insulating film and copper is filled into the holes and the trenches at the same time has been commonly used. The dual damascene process includes a via-first approach in which a via-plug is formed first and a trench-first approach in which a wiring trench is formed first. Among them, the via-first approach is widely employed because of its easiness in dimension control and overlay control during patterning processes.

A conventional example of the via-first approach of the dual damascene process will be explained with reference to cross sectional views in FIGS. 8A to 8H showing fabrication process steps.

As shown in FIG. 8A, on a substrate 111, a first etching stopper film 121, a first interlayer insulating film 122, a second etching stopper film 123, a second interlayer insulating film 124, and a hard mask film 125 are stacked in this order.

Next, as shown in FIG. 8B, a connection hole (via hole) 126 penetrating from the hard mask film 125 to the lowermost first etching stopper film 121 is formed by an optical lithography process and a dry etching process.

Subsequently, as shown in FIG. 8C, an upper surface of the hard mask film 125 is coated with a resin for etching stopper to form a resin film 127 on the surface of the hard mask film 125, and a lower portion of the connection hole 126 is filled with the resin film 127.

After having formed a resist film 128 on the resin film 127 as shown in FIG. 8D, a trench-like wiring pattern 129 is formed in the resist film 128 by the lithography process.

Next, as shown in FIG. 8E, using the resist film 128 as a mask, the resin film 127 exposed at a bottom of the trench-like wiring pattern 129, the resin film 127 formed on a side wall of the connection hole 126, the hard mask film 125 and the second interlayer insulating film 124 are dry-etched to form a wiring trench 130. This etching process stops on the etching stopper film 123. In addition, the resin film 127 filling the bottom of the connection hole 126 serves as a stopper in the etching process of the hard mask film 125 and the second interlayer insulating film 124 so that the substrate 111 immediately under the first etching stopper film 121 is prevented from being damaged due to excessive etching of the first etching stopper film 121. The first etching stopper film 121 is generally formed thin to have a thickness of 20 nm to 100 nm, for example. Therefore, the first etching stopper film 121 is insufficient for serving as an etching stopper used for etching the hard mask film 125 and the second interlayer insulating film 124, and the resin film 127 serving as the etching stopper is required.

Then, the resist film 128 and the resin film 127 are removed by an oxygen ashing as shown in FIG. 8F.

Next, as shown in FIG. 8G, the entire surface of the films is dry-etched so as to remove the second etching stopper film 123 exposed at a bottom of the wiring trench 130 and the first etching stopper film 121 exposed at a bottom of the connection hole 126. At this time, an upper portion of the hard mask film 125 on the top is etched.

Subsequently, as shown in FIG. 8H, inner walls of the connection hole 126 and the wiring trench 130 are coated with thinly formed metal barrier layer 131 and Cu plate seed layer (not shown) so as to fill the connection hole 126 with copper by plating. Thereafter, by a CMP (chemical mechanical polishing) process, excessive copper on the surface is removed. At this time, the hard mask film 125 (see FIG. 8G) serves as a polishing stopper in the CMP process. Subsequently, the hard mask film 125 (see FIG. 8G) is removed by another CMP process under different conditions from the case of copper. In accordance with the above processing, a trench wiring 132 made of copper is formed in the wiring trench 130 and a plug 133 made of copper is formed in the connection hole 126 so that the dual damascene structure is completed.

It is noted that in order to reduce wiring delay, an organic film having a low relative dielectric constant is suggested for the interlayer insulating film. However, in a case where an organic film is used for the interlayer insulating film, there may occur a problem that, because the resin film and the resist film filled in the connection hole are also organic films, the organic interlayer insulating film is stripped off together with the resin film and the resist film due to a line width error or a positioning error in the lithography process.

As a countermeasure for such a problem, a method has been suggested in which, after a hole is formed in an interlayer insulating film, an inorganic film is formed by a sputtering process or a CVD (chemical vapor deposition) process so as to form an organic interlayer insulating film, as disclosed in Japanese Patent Application Publication Hei 11-154703.

According to the method, as shown in FIG. 9A, on an insulating film 213 on which a wiring 212 is formed, an etching stopper film 221 covering the wiring 212, an interlayer insulating film 222, an intermediate hard mask film 223, an interlayer insulating film 224 and a hard mask film 225 are sequentially stacked in this order. After a hole 226 penetrating from the hard mask film 225 to the interlayer insulating film 222 on the etching stopper film 221 is formed, an inorganic oxide film 227 is formed on an upper surface of the hard mask film 225 and an inner wall of the hole 226 by a sputtering process. Next, after an organic anti-reflection film 228 is formed on the inorganic oxide film 227 by coating and a resist film 229 is formed further thereon, a trench wiring pattern 230 is formed on the resist film 229.

According to the technique disclosed in Japanese Patent Application Publication Hei 11-154703, the inorganic oxide film 227 is thickly formed by the sputtering process to be overhung at an opening of the hole 226 so as not to allow the organic anti-reflection film 228 come inside the hole 226.

Furthermore, as shown in FIG. 9B, the organic antireflection film 228 and the inorganic oxide film 227 are anisotropicly etched using the resist film 229 as a mask. The inorganic oxide film 227 in the hole 226 is etched to be lower than the intermediate hard mask film 223. At this time, the inorganic oxide film 227 on a bottom of the hole 226 is etched at the time of etching the inorganic oxide film 227 on an inner wall of the hole 226.

Next, the hard mask film 225 is dry-etched using the resist film 229 as a mask, as shown in FIG. 9C. At this time, there may occur a problem that the etching stopper film 221 thereunder is too much etched to damage the copper wiring 212 under the etching stopper film 221. The hard mask film 225 serves as a covering film for protecting the interlayer insulating films 222 and 224 at the time of finally etching the etching stopper film 221 and as a stopper film in the CMP process after filling the copper in the hole 226. Therefore, the hard mask film 225 should be formed thicker than the etching stopper film 221, and if the etching stopper film 221 is not covered, the etching stopper film 221 is penetrated when the hard mask film 225 is etched.

SUMMARY OF THE INVENTION

As described above, in forming a dual damascene wiring structure according to the via-first approach, there is a problem that in a case of using an organic film as an interlayer insulating film, a resist film cannot be stripped off at a lithography step for forming a trench wiring. Furthermore, even if an inorganic oxide film if formed to have a smaller opening at a hole, there is a problem that in a later step of etching the inorganic oxide film, an etching stopper film covering a copper wiring is etched so that the copper wiring is damaged.

The present invention provides a fabrication method of a semiconductor device in order to solve the above-described problems.

A fabrication method of a semiconductor device of the present invention includes: a step of forming a connection hole in an interlayer insulating film including an organic insulating film; a step of forming an inorganic film covering an upper surface of the interlayer insulating film and an inner surface of the connection hole; a step of forming an organic film filling at least a bottom of the connection hole via the inorganic film on the interlayer insulating film; a step of removing the organic film in the connection hole so as to leave the organic film on a bottom of the connection hole; a step of forming a wiring trench connecting to the connection hole in the interlayer insulating film; a step of removing the organic film inside the connection hole; a step of removing the inorganic film; and a step of forming a trench wiring and a plug continuing from the trench wiring by filling a conductive material in the wiring trench and inside the connection hole.

According to the fabrication method of a semiconductor device as described above, after forming the connection hole, the inorganic film is formed to cover the upper surface of the interlayer insulating film and the inner surface of the connection hole before filling the organic film inside the connection hole. Accordingly, in the later steps, it is possible to remove the resist mask generally used as an etching mask at the time of forming the wiring trench and the organic film filled inside the connection hole without damaging the interlayer insulating film including the organic insulating film by a conventional method. Accordingly, even in a case where an error occurs in a lithography step and a need for reproducing another resist film arises, it is possible to reproduce a resist film without damaging the interlayer insulating film. In addition, when removing the organic film, since a wiring layer formed on the bottom of the connection hole is protected by the inorganic film covering the inner surface of the connection hole, even if the organic film is removed using oxygen plasma, the wiring layer on the bottom of the connection hole is not oxidized.

BRIEF DESCRIPTION OF THE DRAWINGS

FIGS. 8A to 8H of FIG. 8 are cross sectional views each showing a fabrication step of a conventional method of forming a trench wiring structure; and FIGS. 9A to 9C of FIG. 9 are cross sectional views each showing a fabrication step of another conventional method of forming a trench wiring structure.

DESCRIPTION OF THE PREFERRED EMBODIMENTS

An embodiment according to a fabrication method of a semiconductor device of the present invention will be described with reference to a schematic structural cross sectional view of FIG. 1.

Figure 1:
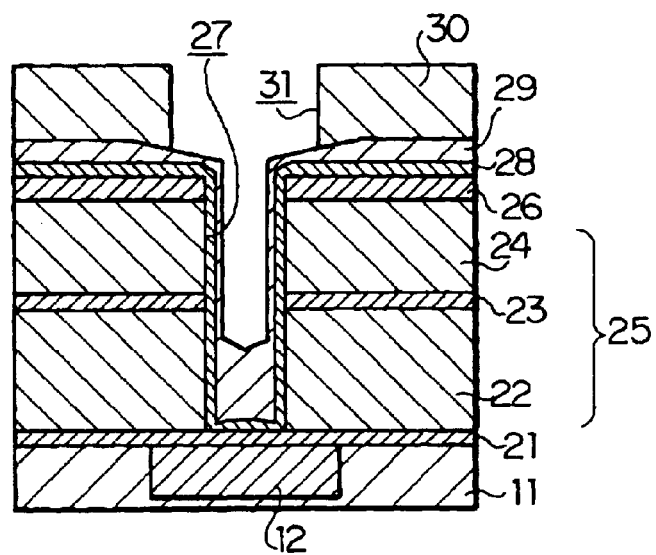
FIG. 1 is a schematic structural cross sectional view showing an embodiment according to a fabrication method of a semiconductor device of the present invention.

As shown in FIG. 1, an insulating film 11 is formed, and a wiring 12 is formed so that a surface thereof is exposed in the insulating film 11. On the insulating film 11, a first etching stopper layer 21, a first organic insulating film 22, a second etching stopper layer 23 and a second organic insulating film 24 are sequentially formed in this order to cover the wiring 12 so as to form an interlayer insulating film 25. Further, a hard mask film 26 is formed on the interlayer insulating film 25.

After forming a resist mask (not shown) for forming a connection hole by means of a lithography process using a usual resist, the hard mask film 26 is etched by etching using the resist mask. Thereafter, the resist mask is removed. Since the interlayer insulating film 25 is protected by the hard mask film 26 at an area other than an area on which a connection hole of the interlayer insulating film 25 is formed, the resist mask can be removed by a conventional resist removal process. Subsequently, using the hard mask film 26 as an etching mask, a connection hole 27 penetrating from the second organic insulating film 24 to the first organic insulating film 22 on the etching stopper layer 21.

Next, an inorganic film 28 covering an upper surface of the interlayer insulating film 25 and an inner surface of the connection hole 27 is formed. The inorganic film 28 is not be limited in its material and film forming method as far as it is not removed by a conventional oxygen ashing process or a generally used resist remover solution. For example, a silicon oxide film, a silicon nitride film and a silicon carbide film formed by a CVD (chemical vapor deposition) process and a titanium nitride film, a tantalum nitride film and a tantalum film formed by a sputtering process may be used as the inorganic film 28. Step coverage with higher conformality is preferred. The maximum thickness of the inorganic film 28 is set to be 20% or less of a diameter of the hole at a side wall portion of the connection hole 27 so as not to be overhung at an opening of the connection hole 27, and the minimum thickness of the inorganic film 28 is set to be 5 nm or more to have a film thickness which causes no damage on the interlayer insulating layer 25 in a resist stripping (removal) step. Preferably, the thickness of the inorganic film 28 is set to be 8 nm or more and 15 nm or less.

Subsequently, an organic film 29 is formed so as to cover the surface of the inorganic film 28 and to fill the bottom of the connection hole 27. Next, after forming the resist film 30 on the organic film 29, an opening 31 for forming a wiring trench is formed by a usual lithography process. Thereafter, using the resist film 30 as an etching mask, the organic film 29, the inorganic film 28 and the interlayer insulating film 25 are etched so as to form a wiring trench (not shown).

During the above etching process of forming the wiring trench, first, the organic film 29 is etched. Since an upper portion of the resist film 30 is also etched at that time, the resist film 30 is formed to be thick enough even after etching the organic film 29 in advance. Next, the inorganic film 28 at a portion where a wiring trench is to be formed is etched. At this time, since the organic film 29 is left at the bottom of the connection hole 27, the bottom of the connection hole 27 is protected from being etched. When the interlayer insulating film 25 is etched, the upper portion of the organic film 29 at the bottom of the connection hole 27 is etched off. Accordingly, the organic film 29 is formed thick enough to be left on the bottom of the connection hole 27 after completion of the etching of the interlayer insulating film 25. Forming the organic film 29 as described above may protect the bottom of the connection hole 27 from being etched excessively.

In addition, in the fabrication process described above, since the exposed portion of the interlayer insulating film 25 including the first organic insulating film 22 and the second organic insulating film 24, in other words, the inner wall of the connection hole 27, is covered with the inorganic film 28, even if the organic film 29 and the resist film 30 used for forming the wiring trench are coated thereon in the later steps, it is possible to remove (strip) the organic film 29 and the resist film 30 without damaging the organic interlayer insulating film 25 by a conventional ashing technique or a cleaning technique. Accordingly, even in a case where an error occurs in a lithography step and a need for reproducing the resist film 30 arises, it is possible to reproduce the resist film 30 without damaging the interlayer insulating film 25. In addition, when removing the organic film 29, since the wiring 12 formed on the bottom of the connection hole 27 is protected by the inorganic film 28 covering the inner surface of the connection hole 27, even if the organic film 29 is removed using oxygen plasma, the wiring 12 on the bottom of the connection hole 27 is not oxidized.

Although the first etching stopper film 21 and the second etching stopper film 23 are used in the above fabrication process, if the etching can be controlled at boundary surfaces of the first organic insulating film 22 and the second organic insulating film 24, the etching stopper film is not always necessary.

Now, a process of completely filling inside of the connection hole 27 with the organic film 29 will be described with reference to schematic structural cross sectional views in FIG. 2 and FIG. 3.

Figure 2A:
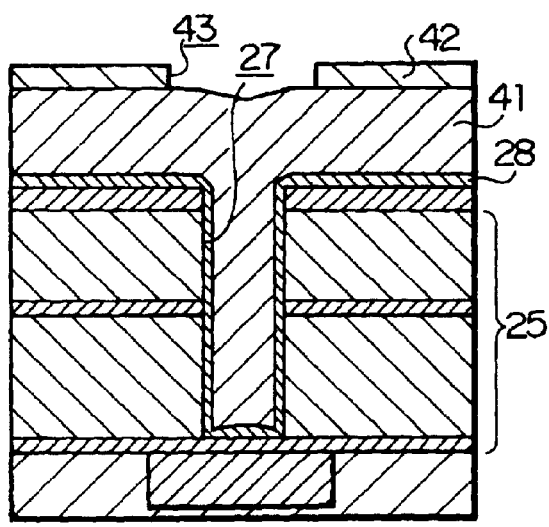
FIGS. 2A to 2B are schematic structural cross sectional views showing another embodiment according to the fabrication method of a semiconductor device of the present invention.
Figure 2B:
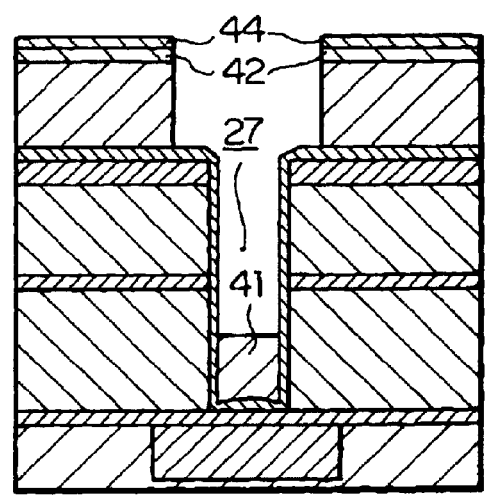

A first example is explained with reference to FIG. 2. As shown in FIG. 2A, similarly to those described with reference to FIG. 1, after a connection hole 27 is formed in an interlayer insulating film 25, an inorganic film 28 is formed on an inner surface of the connection hole 27 and on an upper surface of the interlayer insulating film 25. Then, an organic film 41 is formed on the inorganic film 28 so as to fill inside the connection hole 27. Furthermore, after a resist film 42 is formed with a resist containing Si on the organic film 41, an opening 43 for forming a wiring trench by a lithography process is formed. However, in a case of dry development, when etching the organic film 41, the organic film 41 is left at the bottom of the connection hole 27 as shown in FIG. 2B, and it is used as an etching stopper in the later steps. In addition, in a case of dry development using oxygen, a surface of the resist film 42 is oxidized and a silicon oxide (SiO) layer 44 is formed.

Figure 3A:
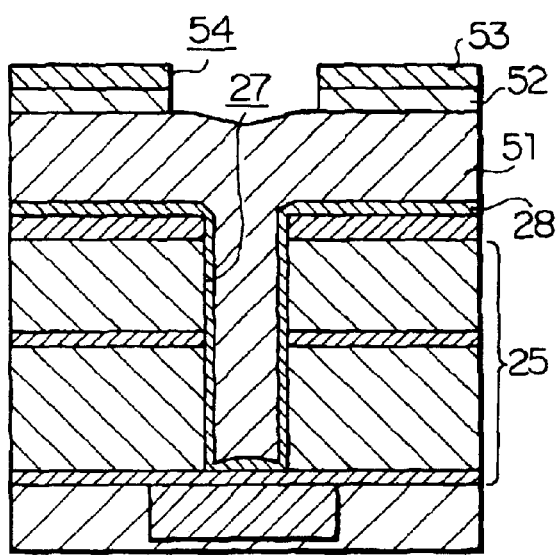
FIGS. 3A to 3B are schematic structural cross sectional views showing still another embodiment according to the fabrication method of a semiconductor device of the present invention.
Figure 3B:
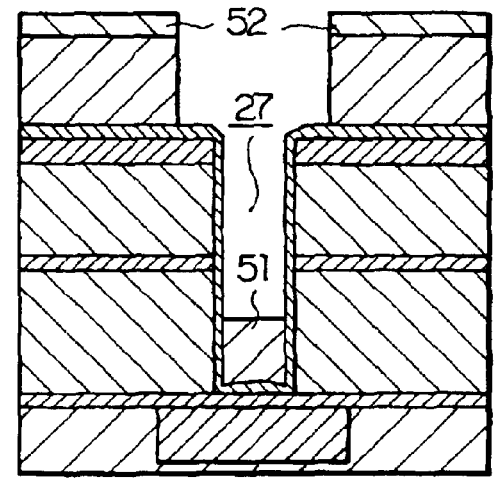

A second example is explained with reference to FIG. 3A and 3B. As shown in FIG. 3A, similarly to those described with reference to FIG. 1, after a connection hole 27 is formed in an interlayer insulating film 25, an inorganic film 28 is formed on an inner surface of the connection hole and on an upper surface of the interlayer insulating film 25. Then, an organic film 51 is formed on the inorganic film 28 so as to fill inside the connection hole 27. Furthermore, after an SOG (Spin On Glass) film 52 is formed on the organic film 51, a resist film 53 is formed. Subsequently, an opening 54 for forming a wiring trench by a lithography process is formed in the resist film 53. Using the resist film 53 for an etching mask, the SOG film 52 is etched. However, in a case of dry development, when etching the organic film 51, the organic film 51 is left at the bottom of the connection hole 27 as shown in FIG. 3B, and it is used as an etching stopper in the later steps. In the step of etching the organic film 51, the resist film 53 on the SOG film 52 (see FIG. 3A) is completely removed.

Now, a specific fabrication process according to the fabrication method of the present invention described with reference to FIG. 1 will be explained with reference to FIGS. 4A to 4F and FIGS. 5A to 5E.

Figure 4A:
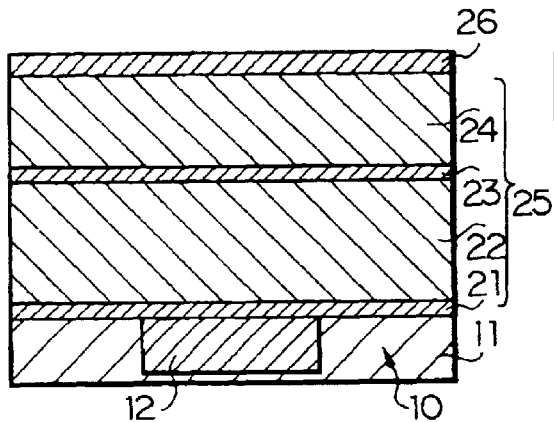
FIGS. 4A to 4F are cross sectional views each showing a fabrication step of a specific fabrication process according to the fabrication method of a semiconductor device of the present invention.

As shown in FIG. 4A, on a substrate 10 composed of the interlayer insulating film 11 and the copper wiring 12 formed therein, the first etching stopper layer 21 is formed by depositing silicon nitride (SiN) in a thickness of 50 nm by a CVD (chemical vapor deposition) process, for example. Next, the first organic insulating film 22 is formed to have a thickness of 350 nm on the first etching stopper layer 21. The first organic insulating film 22 is formed by, for example, after forming a film by spin coating, heating the substrate at 130° C. for 90 seconds to volatilize a solvent in the film. Then, the substrate 10 is heated at 300° C. for one hour to cure the first organic insulating film 22. Polyarylether resin may be used as the first organic insulating film 22. The relative dielectric constant of this polyarylether resin is 2.6. Next, silicon nitride (SiN) is deposited in a thickness of 50 nm on the first organic insulating film 22 by a CVD (chemical vapor deposition) process, for example, so as to form the second etching stopper layer 23. Next, the second organic insulating film 24 is formed to have a thickness of 180 nm on the second etching stopper layer 23. The second organic insulating film 24 is formed by, for example, after forming a film by spin coating, heating the substrate at 130° C. for 90 seconds to volatilize a solvent in the film. Then, the substrate 10 is heated at 300° C. for one hour to cure the second organic insulating film 24. The second organic insulating film 24 may be composed of a material similar to that of the first organic insulating film 22. In this way, the interlayer insulating film 25 is formed. Furthermore, the hard mask film 26 is formed by depositing silicon nitride (SiN) in a thickness of 120 nm on the interlayer insulating film 25 by a CVD process, for example.

Figure 4B:
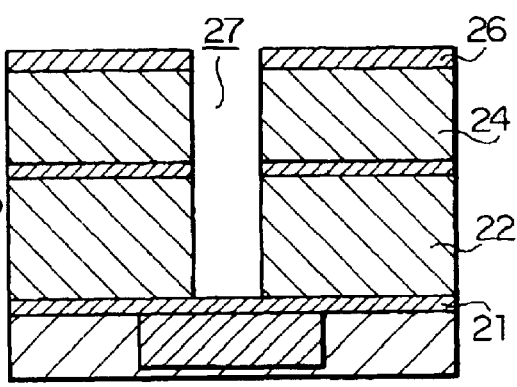

Next, as shown in FIG. 4B, the connection hole 27 penetrating from the hard mask film 26 to the first etching stopper film 21 is formed by a lithography process and a dry etching process. In the lithography step, a hole pattern is formed on an acetal-based chemically amplified positive resist film using a KrF excimer laser exposure apparatus. In addition, for avoiding reflection, an organic anti-reflection film is used for a lower layer of the resist film. The connection hole 27 is formed to have a minimum pitch of 360 nm and a diameter of 180 nm, for example. Reactive ion etching using trifluoromethane ($CHF_3$), argon (Ar) and oxygen ($O_2$) is carried out for the etching of the hard mask film 26. Ammonia ($NH_3$) and hydrogen ($H_2$) are used for the etching of the second organic insulating film 24. As an etching gas for the second etching stopper film 23, octafluorocyclopentene ($C_5F_8$), difluoromethane ($CH_2F_2$) argon (Ar) and oxygen ($O_2$) is used. Reactive etching using ammonia (NH3) and hydrogen ($H_2$) is carried out for the etching of the first organic insulating film 22. The resist film and the organic anti-reflection film are etched and removed at the time of the etching of the second organic insulating film 24. After the resist film is removed, the hard mask film 26 serves as an etching mask.

Figure 4C:
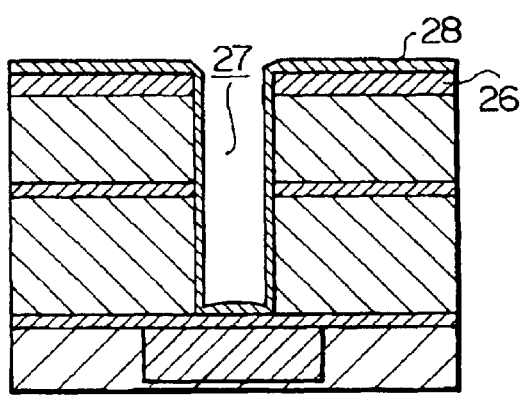

Next, as shown in FIG. 4C, the inorganic film 28 is formed on the upper surface of the hard mask film 26 and the inner surface of the connection hole 27. The inorganic film 28 is formed with a silicon oxide (SiO) film by a CVD process, for example. The inorganic film 28 is formed to have a thickness of 20 nm on the upper surface of the hard mask film 26 and the bottom of the connection hole 27 and a thickness of 10 nm on the inner wall of the connection hole 27. Conditions for forming the inorganic film 28 are as follows. A parallel plate plasma CVD apparatus is used for a film-forming apparatus. TEOS (Tetra Ethyl Ortho Silicate) and oxygen ($O_2$) are used for a material gas for film forming. The film-forming apparatus is set to have a chamber pressure of 400 Pa, a substrate temperature of 400° C., an RF power of 250 W and a film-forming duration of 5 seconds.

Figure 4D:
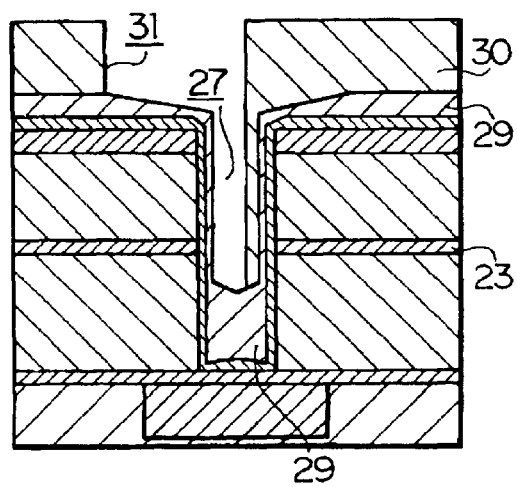

Next, as shown in FIG. 4D, the organic film 29 for filling the bottom of the connection hole 27 is coated. The organic film 29 also serves as an anti-reflection film. It is desirable that the organic film 29 inside the connection hole 27 has a thickness less than that of the second etching stopper film 23 formed between the organic insulating films 22 and 24. On the entire surface of the organic film 29, the resist film 30 is formed by means of the coating method. The resist film 30 is formed with a chemically amplified negative resist film, for example, to have a thickness of 530 nm on the surface of the organic film 29. Thereafter, the opening 31 for forming a wiring trench is formed by a lithography process. In the lithography process, using a KrF excimer laser exposure apparatus, for example, the opening 31 for forming the wiring trench 27 having a wiring pattern with a minimum pitch of 360 nm and a minimum width of 180 nm, for example, is formed. Of course, it is ideal that there is no displacement of the opening 31 for forming the wiring trench against the connection hole 27. However, for showing that the present invention can be realized even if the displacement occurs, in the figure, a state that an end of the opening 31 for forming the wiring trench invades inside the connection hole 27 is illustrated.

In the lithography step for the resist film 30, if the resultant film is out of the line width standard or the positioning standard, the organic film 29 and the resist film 30 may be stripped off and another organic film 29 and another resist film 30 may be coated. The organic film 29 and the resist film 30 are stripped by cleaning with a washing liquid after oxygen plasma ashing. The oxygen plasma ashing is carried out using a down-flow asher, for example. The ashing process is carried out for 90 seconds by supplying oxygen ($O_2$) as an ashing gas at 1700 $cm^3$/m and a mixed gas of hydrogen ($H_2$) and nitrogen ($N_2$) as a buffer gas at 400 $cm^3$/m, and setting a gas pressure in an ashing atmosphere to 200 Pa, RF power to 1700 W and a substrate temperature to 200° C. For cleaning, an SC-1 cleaning ($NH_4OH$—$H_2O_2$—$H_2$) and an SC-2 cleaning (HCl—$H_2O_2$—$H_2O$), which belong to a generally employed RCA cleaning process are adapted. In the stripping step, the polyarylether resin constituting the organic insulating films 22 and 24 of the interlayer insulating film 25 is protected by the SiO film of the inorganic film 28 and is not damaged.

Figure 4E:
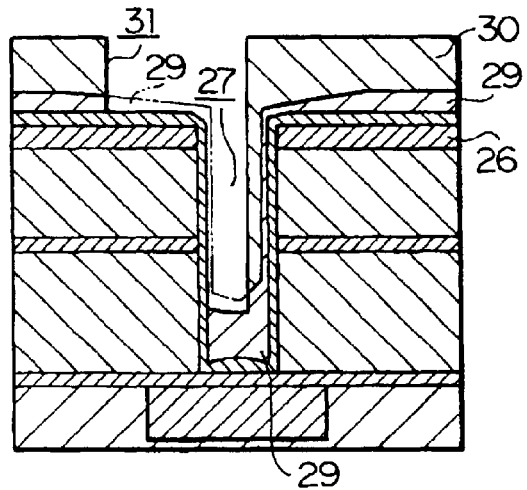

Next, as shown in FIG. 4E, using the resist film 30 as a mask, the organic film 29 (a portion indicated with a double dotted chain line) exposed inside the opening 31 of the resist film 30 is etched. In this etching step, using tetrafluoromethane ($CF_4$), oxygen ($O_2$) and argon (Ar) as an etching gas, the organic film 29 over the hard mask 26 in the opening 31 and on the side wall of the connection hole 27 is removed leaving the organic film 29 on the bottom of the connection hole 27. At this time, the organic film 29 formed on an upper inner wall of the connection hole 27 and over the hard mask film 26 is also removed at the same time.

Figure 4F:
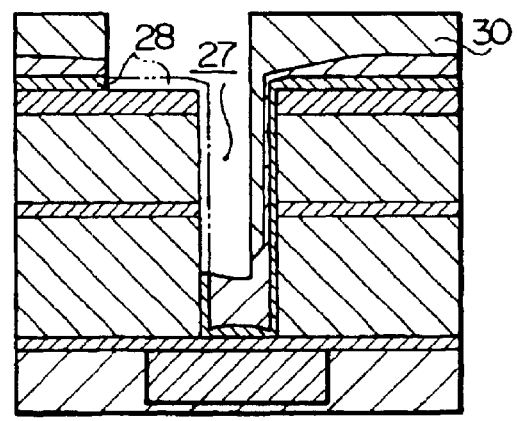

Next, as shown in FIG. 4F, using the resist film 30 as a mask and octafluorocyclobutane ($C_4F_8$), oxygen ($O_2$) and argon (Ar) as an etching gas, an exposed portion (indicated with a double dotted chain line) of the inorganic film 28 is etched. The inorganic film 28 on the inner wall of the connection hole 27 is thin with a thickness of about 10 nm, and it can be removed by over-etching of around 30%, for example.

Figure 5A:
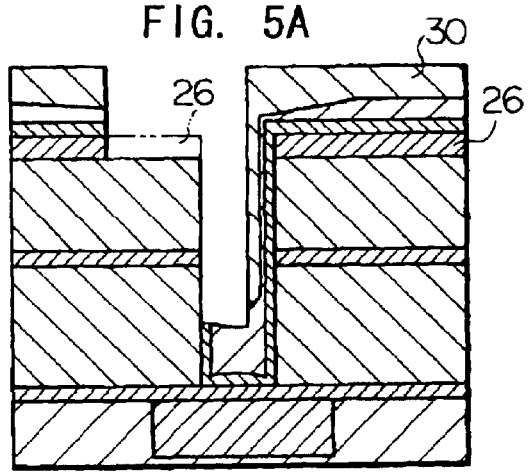
FIGS. 5A to 5E are cross sectional views each showing a fabrication step of the specific fabrication process of the fabrication method of a semiconductor device of the present invention, which are subsequent to FIG. 4F.

Next, as shown in FIG. 5A, using the resist film 30 as a mask and octafluorocyclopentene ($C_5F_8$), difluoromethane ($CH_2F_2$), argon (Ar) and oxygen ($O_2$) as an etching gas, the hard mask film 26 (indicated with a double dotted chain line) is etched.

Figure 5B:
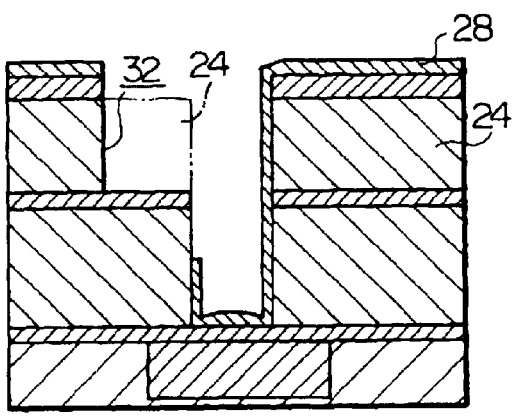

As shown in FIG. 5B, using the resist film 30 (see FIG. 5A) or the inorganic film 28 as a mask and ammonia ($NH_3$) and hydrogen ($H_2$) as an etching gas, the organic insulating film 24 (indicated with a double dotted chain line) is etched to form the wiring trench 32. Since this etching step is carried out under a condition for etching organic material, the organic films including the resist film 30 and the organic film 29 are etched to be completely removed. Accordingly, the etching mask shifts in the order of the resist film 30, the organic film 29 and the inorganic film 28.

Figure 5C:
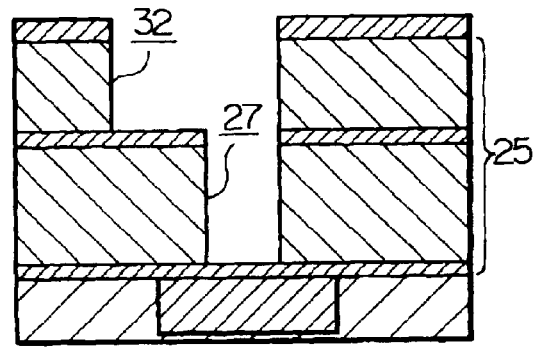

Next, the entire surface is etched using octafluorocyclobutane ($C_4F_8$), oxygen ($O_2$) and argon (Ar) as an etching gas to completely remove the inorganic film 28. As a result, as shown in FIG. 5C, the wiring trench 32 is formed at an upper portion of the interlayer insulating film 25, and the connection hole 27 is formed in the interlayer insulating film 25 at the bottom of the wiring trench 32.

Figure 5D:
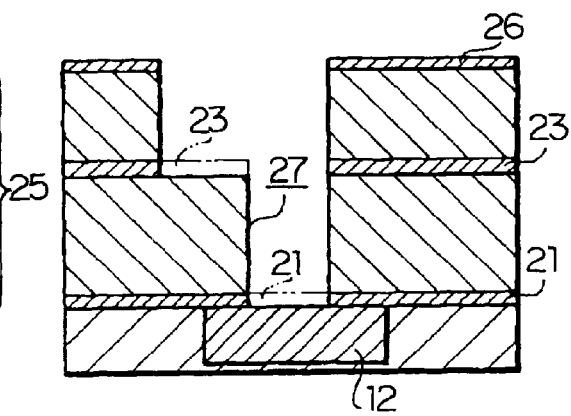

Next, as shown in FIG. 5D, using octafluorocyclopentene ($C_5F_8$), difluoromethane ($CH_2F_2$) argon (Ar) and oxygen ($O_2$) as an etching gas, exposed portions (indicated with a double dotted chain line) of the etching stopper films 21 and 23 composed of silicon nitride is etched to expose the wiring 12 at the bottom of the connection hole 27. At this time, an upper portion of the hard mask film 26 is also etched.

Figure 5E:
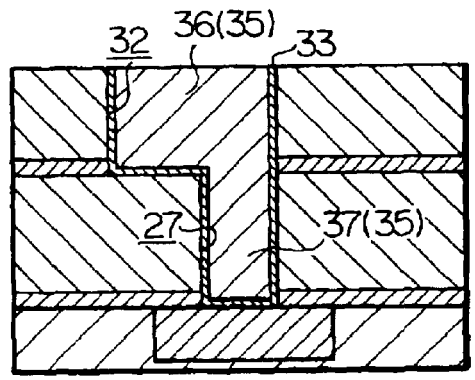

Then, as shown in FIG. 5E, after a tantalum film as a barrier layer 33 is formed in a thickness of 15 nm to 30 nm on inner walls of the wiring trench 32 and the connection hole 27 by a sputtering process, a copper plate seed layer (not shown) is formed in a thickness of 10 nm to 15 nm. Subsequently, inside of the wiring trench 32 and the connection hole 27 are filled with copper 35 by a plating process. At this time, the copper 35 is deposited also on the hard mask film 26. Thereafter, an excessive portion on the surface of the copper 35, the copper plate seed layer (not shown) the barrier layer 33 and the hard mask film 26 (see FIG. 5D) are removed by a CMP (chemical mechanical polishing) process. As a result, a trench wiring 36 is formed with the copper 35 filled in the wiring trench 32 and a plug is formed with the copper 35 filled in the connection hole 27 to have a copper wiring structure.

Now, a modification of the specific fabrication process described with reference to FIG. 1 will be explained with reference to FIGS. 4A to 4F and FIGS. 5A to 5E will be explained below.

In a first modification, instead of forming the inorganic film 28 with a silicon oxide film, the inorganic film 28 may be formed with a titanium nitride (TiN) film by a sputtering process. In the film-forming step, the inorganic film 28 is formed to have a thickness of 20 nm on the surface of the hard mask film 26 and on the bottom of the connection hole 27 and a thickness of 10 nm on the inner wall of the connection hole 27. Conditions for forming the inorganic film 28 composed of the titanium nitride film will be described below. As a film-forming apparatus, a DC magnetron sputtering system is used, for example. As a target, a titanium nitride (TiN) target is used. A mixed gas comprising 30% of argon (Ar) and 70% of and nitrogen ($N_2$) is used as a gas in a sputtering atmosphere. The sputtering system is set to have a chamber pressure of 0.8 mPa, a DC power of 6 kW, and an RF power of 175 W. The etching of the inorganic film 28 composed of the titanium nitride is carried out using a usual plasma etching apparatus and chlorine ($Cl_2$) and nitrogen ($N_2$) as an etching gas, under conditions of supplying the chlorine ($Cl_2$) at 100 $cm^3$/min and the nitrogen ($N_2$) at 50 $cm^3$/min and setting the RF power of the plasma etching apparatus to 175 W.

Figure 6:
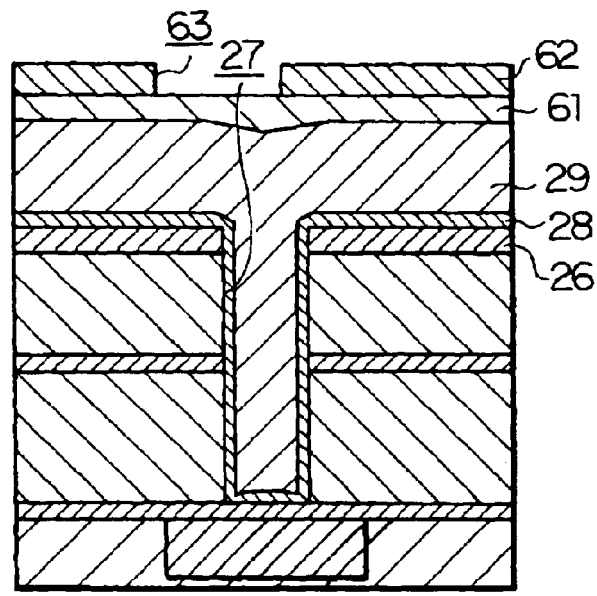
FIG. 6 is a schematic structural cross sectional view showing a modified example of the specific fabrication process according to the fabrication method of a semiconductor device of the present invention.

In a second modification, after forming the inorganic film 28 as described with reference to FIG. 4C, a triple-layer resist process structure as shown in FIG. 6 is employed.

In specific, as shown in FIG. 6, inside of the connection hole 27 and on the hard mask film 26, the organic film 29 is formed having the inorganic film 28 therebetween. The organic film 29 is formed by baking after a novolac resin is coated by spin coating, for example. The organic film 29 is formed to have a thickness of 350 nm on a flat surface of the hard mask film 26.

Next, an inorganic film 61 for forming an inorganic mask is formed with an SOG film composed of an organo polysiloxane copolymer. The SOG film is formed by baking after the SOG liquid is coated to have a thickness of 130 nm, for example, by coating process.

Next, on the entire surface of the inorganic film 61, a resist film 62 is formed by a coating process. The resist film 62 is formed with a chemically amplified negative resist film, for example, to have a thickness of 320 nm on the surface of the inorganic film 61. Thereafter, an opening 63 for forming a wiring trench is formed by a lithography process. In the lithography process, using a KrF excimer laser exposure apparatus, for example, the opening 63 for forming the wiring trench 27 having a wiring pattern with a minimum pitch of 360 nm and a minimum width of 180 nm, for example, is formed. Of course, it is ideal that there is no displacement of the opening 63 for forming the wiring trench against the connection hole 27. However, for showing that the present invention can be realized even if the displacement occurs, in the figure, a state that an end of the opening 63 for forming the wiring trench invades inside the connection hole 27 is illustrated.

In the lithography process for the resist film 62, if the resultant film is out of the line width standard or the positioning standard, films from the resist film 62 to the organic film 29 may be stripped off and another set of films from the organic film 29 to the resist film 62 may be formed. The resist film 62 is stripped using gamma butyl lactone, for example. The SOG film being the inorganic film 61 is stripped using a 1% hydrofluoric acid solution, for example. The organic film 29 composed of a novolac resin is stripped using the oxygen plasma ashing and cleaning is carried out at the last step. The oxygen plasma ashing is carried out using a down-flow asher, for example. The ashing process is carried out for 120 seconds by supplying oxygen ($O_2$) as an ashing gas at 1700 $cm^3$/m and a mixed gas of hydrogen ($H_2$) and nitrogen ($N_2$) as a buffer gas at 400 $cm^3$/m, and setting a gas pressure in an ashing atmosphere to 200 Pa, an RF power to 1700 W and a substrate temperature to 200° C. For cleaning, the SC-1 cleaning ($NH_4OH$—$H_2O_2$—$H_2$) and the SC-2 cleaning (HCl—$H_2O_2$—$H_2O$), which belong to the generally employed RCA cleaning process are adapted. In the stripping step, the polyarylether resin constituting the organic insulating films 22 and 24 of the interlayer insulating film 25 is protected by the SiO film of the inorganic film 28 and is not damaged.

Figure 7:
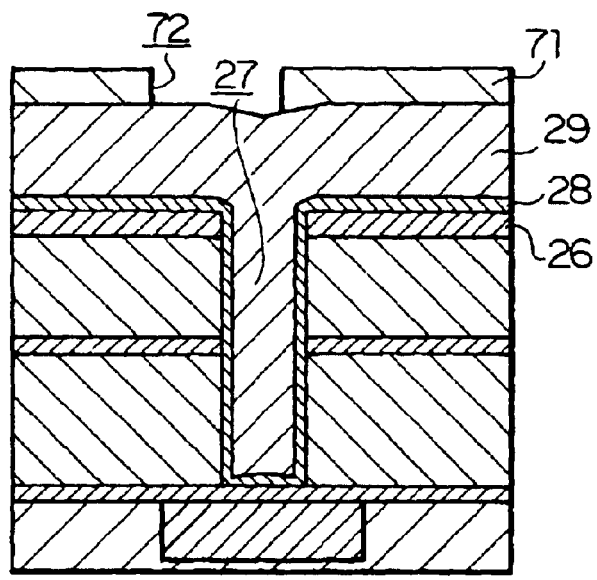
FIG. 7 is a schematic structural cross sectional view showing a modified example of the specific fabrication process according to the fabrication method of a semiconductor device of the present invention.

In a third modification, after the inorganic film 28 is formed as described with reference to FIG. 4C, a silicon containing resist process structure as shown in FIG. 7 is employed.

That is, as shown in FIG. 7, inside of the connection hole 27 and on the hard mask film 26, the organic film 29 is formed having the inorganic film 28 therebetween. The organic film 29 is formed by baking after a novolac resin is coated by spin coating, for example. The organic film 29 is formed to have a thickness of 350 nm on a flat surface of the hard mask film 26.

On the entire surface of the organic film 29, a resist film 71 is formed by a coating process. The resist film 71 is formed with a chemically amplified positive silicon-containing resist film, for example, to have a thickness of 320 nm on the surface of the organic film 29. Thereafter, an opening 72 for forming a wiring trench is formed by a lithography process. In the lithography process, the wiring pattern is formed by developing using an alkaline solution after exposing a pattern using a KrF excimer laser exposure machine, for example. Of course, it is ideal that there is no displacement of the opening 72 for forming the wiring trench against the connection hole 27. However, for showing that the present invention can be realized even if the displacement occurs, in the figure, a state that an end of the opening 72 for forming the wiring trench invades inside the connection hole 27 is illustrated.

In the lithography process for the resist film 71, if the resultant film is out of the line width standard or the positioning standard, films from the resist film 71 to the organic film 29 may be stripped and another set of films of the organic film 29 and the resist film 71 may be formed. The resist film 71 and the organic film 29 composed of a novolac resin are stripped using the oxygen plasma ashing and a cleaning is carried out at the last step. The oxygen plasma ashing is carried out using a down-flow asher to perform ashing of two steps.

A first step ashing process is carried out for 30 seconds by supplying oxygen ($O_2$) as an ashing gas at 1700 $cm^3$/m and a mixed gas of hydrogen ($H_2$) and nitrogen ($N_2$) as a buffer gas at 400 $cm^3$/m, and setting a gas pressure in an ashing atmosphere to 200 Pa, an RF power to 1700 W and a substrate temperature to 200° C.

A second step ashing is carried out for 120 seconds by supplying oxygen ($O_2$) as an ashing gas at 1700 $cm^3$/m and a mixed gas of hydrogen ($H_2$) and nitrogen ($N_2$) as a buffer gas at 400 $cm^3$/m, and setting a gas pressure in an ashing atmosphere to 200 Pa, an RF power to 1700 W and a substrate temperature to 200° C. For cleaning, the SC-1 cleaning ($NH_4OH$—$H_2O_2$—$H_2$) and the SC-2 cleaning (HCl—$H_2O_2$—$H_2O$), which belong to the generally employed RCA cleaning process are adapted. In the stripping step, the polyarylether resin constituting the organic insulating films 22 and 24 of the interlayer insulating film 25 is protected by the SiO film of the inorganic film 28 and is not damaged.

As described above, according to the fabrication process of a semiconductor device of the present invention, a wiring structure having a trench wiring and a plug connecting to a bottom of the trench wiring in an interlayer insulating film using an organic insulating film can be easily fabricated without damaging the organic insulating film. Accordingly, it is possible to use an organic insulating film being a low dielectric constant film having a relative dielectric constant of 3 or less and to have a low capacity between wiring so that a semiconductor device with a low power consumption capable of operating at a high speed can be easily fabricated and it can be highly integrated because of its trench wiring structure. In addition, it is possible to reproduce a resist film, an organic film or the like at the time of forming a wiring trench so that yield thereof can be improved.

What is claimed is:

1. A fabrication method of a semiconductor device, comprising:

a step of forming a connection hole in an interlayer insulating film including an organic insulating film;

a step of forming an inorganic film covering on an upper surface of the interlayer insulating film and an inner surface of the connection hole;

a step of forming an organic film embedding at least a bottom of the connection hole via the inorganic film on the interlayer insulating film;

a step of removing the organic film in the connection hole so as to leave the organic film on a bottom of the connection hole;

a step of forming a wiring trench connecting to the connection hole in the interlayer insulating film;

a step of removing the organic film inside the connection hole;

a step of removing the inorganic film; and a step of forming a trench wiring by filling a conductive material in the wiring trench and inside the connection hole and forming a plug continuing from the trench wiring.

2. A fabrication method according to claim 1, wherein after a Spin On Glass film is formed on the organic film, a resist film is formed.

3. A fabrication method according to claim 1, wherein within the step of forming the organic film, the organic film is formed inside of the connection hole and on a hard mask film, the inorganic film being disposed between the hard mask film and the organic film.

4. A fabrication method according to claim 1, wherein the inorganic film may be formed with a titanium nitride film by a sputtering process.

5. A fabrication method according to claim 1, wherein a resist film is formed by a coating process on the surface of the organic film.

6. A fabrication method according to claim 1, wherein the step of removing the organic film inside the connection hole is preformed after the step of forming the wiring trench.

7. A fabrication method according to claim 1, wherein the step of removing the inorganic film is performed after the step of removing the organic film inside the connection hole.

8. A fabrication method according to claim 1, wherein in the step of removing the inorganic film, the inorganic film is completely removed from within the connection hole.

9. A fabrication method according to claim 1, wherein in the step of removing the inorganic film, the inorganic film is partially removed from within the connection hole.

10. A fabrication method according to claim 1, wherein a portion of the interlayer insulating film is removed to form the wiring trench.

* * * * *